United States Patent
Neer et al.

(10) Patent No.: US 7,322,850 B2
(45) Date of Patent: Jan. 29, 2008

(54) ADAPTER MODULE WITH A COMPLIANT PRESS-FIT MOUNTING PINS

(75) Inventors: Jay H. Neer, Boca Raton, FL (US); Christopher P. Dirkers, Calico Rock, AR (US); Edward Seamands, Little Rock, AR (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/474,823

(22) Filed: Jun. 26, 2006

(65) Prior Publication Data

US 2006/0246766 A1    Nov. 2, 2006

Related U.S. Application Data

(62) Division of application No. 10/878,853, filed on Jun. 28, 2004, now Pat. No. 7,066,762.

(60) Provisional application No. 60/483,379, filed on Jun. 27, 2003.

(51) Int. Cl.
  H01R 13/60    (2006.01)
  H01R 13/66    (2006.01)
  H01R 13/62    (2006.01)
  H01R 13/64    (2006.01)
(52) U.S. Cl. .................. 439/567; 439/372; 439/571
(58) Field of Classification Search ............ 439/567, 439/372, 571
  See application file for complete search history.

(56) References Cited

U.S. PATENT DOCUMENTS

| | | | |
|---|---|---|---|
| 4,204,738 A | | 5/1980 | Tillotson |
| 4,897,039 A | | 1/1990 | Uchida et al. |
| 4,929,194 A | * | 5/1990 | Korsunsky et al. ......... 439/571 |
| 4,969,838 A | | 11/1990 | Himes, Jr. et al. |
| 5,076,803 A | | 12/1991 | Mutarelli et al. |
| 5,230,638 A | * | 7/1993 | DiViesti ..................... 439/567 |
| 5,257,947 A | * | 11/1993 | Scheer et al. ............... 439/567 |
| 5,328,389 A | * | 7/1994 | Lewis et al. ................ 439/567 |
| 5,344,194 A | | 9/1994 | Hatagishi et al. |
| 5,666,266 A | | 9/1997 | Katoh et al. |
| 5,697,812 A | * | 12/1997 | Sampson et al. ........... 439/567 |
| 5,901,263 A | | 5/1999 | Gaio et al. |
| 6,000,957 A | | 12/1999 | Betker et al. |
| 6,007,375 A | * | 12/1999 | Mackowiak et al. ........ 439/567 |
| 6,062,893 A | | 5/2000 | Miskin et al. |
| 6,351,394 B1 | | 2/2002 | Cunningham |

(Continued)

OTHER PUBLICATIONS

International Publication No. WO 01/59885 A2 published Aug. 16, 2004, Solid State Stamping, Inc.
International Publication No. WO 03/088727 A1 published on Oct. 23, 2003, Molex Incorporated.

*Primary Examiner*—Hae M Hyeon
(74) *Attorney, Agent, or Firm*—Thomas D. Paulius (57) ABSTRACT

An adapter module is provided with a bail latch mechanism that serves to engage and disengage the frame into which the adapter module fits. The bail latch is movable between two positions and it engages a cam member formed as part of the module that cams two opposing free ends of the bail latch inwardly into the module to thereby release it from the adapter frame. The adapter frame includes a wear sleeve that cams the bail latch free ends inwardly during some insertions of the module. C-shaped press fit pins are made with the adapter frame for better engagement with the circuit board.

8 Claims, 13 Drawing Sheets

U.S. PATENT DOCUMENTS

| | | | |
|---|---|---|---|
| 6,368,153 B1 * | 4/2002 | Hwang | 439/607 |
| 6,430,053 B1 * | 8/2002 | Peterson et al. | 361/728 |
| 6,434,015 B1 | 8/2002 | Hwang | |
| 6,439,918 B1 | 8/2002 | Togami et al. | |
| 6,443,768 B1 | 9/2002 | Dirkers et al. | |
| 6,533,603 B1 | 3/2003 | Togami | |
| 6,565,367 B2 * | 5/2003 | Budman et al. | 439/82 |
| 6,672,901 B2 * | 1/2004 | Schulz et al. | 439/607 |
| 6,788,540 B2 * | 9/2004 | Kruger et al. | 361/719 |
| 6,793,517 B2 | 9/2004 | Neer et al. | |
| 6,811,413 B2 * | 11/2004 | Keeble et al. | 439/79 |
| 7,023,703 B2 * | 4/2006 | Peloza | 361/727 |

* cited by examiner

ADAPTER MODULE WITH A COMPLIANT PRESS-FIT MOUNTING PINS

REFERENCE TO RELATED APPLICATIONS

This application is a divisional application of U.S. patent application Ser. No. 10/878,853, filed Jun. 28, 2004 now U.S. Pat. No. 7,066,762, which application claims priority of U.S. Provisional Patent Application No. 60/483,379, filed Jun. 27, 2003.

BACKGROUND OF THE INVENTION

The present invention relates generally to adapter modules, and more particularly to improvements in adapter frames receive modules with a module retention assembly that is used to engage the module in place or to release it from engagement with the adapter frame.

Adapter frames or modules are used in many different applications and are usually used to contain an electrical component, such as an optical transceiver or a cable to board connector. Adapter modules are used in a wide variety of applications that range from simple connecting faces between hard (copper) conductor wiring to more sophisticated applications that may involve optical fibers, flexible or printed cables, etc. In many instances, adapter modules house converters that are used to convert optical signals or electrical signals or electrical signals to optical signals. These modules are used to convert high speed signals from either copper to optical or optical to copper, while maintaining the signals at high speeds, such as in the gigabit range. These adapter modules are placed into adapter frames that are usually attached to a circuit board, and the modules are retained in place in the adapter frames by retention means.

One such retention means is the use of thumbscrews. These thumbscrews are difficult to operate in environments with many cables, for the user has to move the cables to the side when installing, removing or reconfiguring the cables. Thus, these adapter modules are not easily pluggable.

Adapter modules may also have some sort of engagement mechanism or assembly integrated therewith which serves to engage with and disengage from a corresponding adapter frame. Repeated engagement and disengagement cycles may result in wear to the adapter frame at areas of contact with the module engagement mechanism. If there is a close tolerance between the adapter frame and the module engagement mechanism, the wear that occurs may adversely affect the engagement between the module and its adapter frame.

Accordingly, the present invention is directed to an improved adapter frame that provides resistance against wear due to repeated engagement cycles with a module and which has improved mounting members disposed on the frame.

SUMMARY OF THE INVENTION

It is therefore a general object of the present invention to provide an adapter module that easily slides into a an adapter frame and which uses a moveable latch to retain it in place within the frame.

Another object of the present invention is to provide an adapter module that utilizes a simple wire bail latch having two free ends that engage openings in the frame, and the bail latch is moveable about its free ends between two positions, wherein in one of the two positions, the free ends of the bail latch extend outwardly from the adapter module to provide interfering posts that serve to retain the adapter module in place within the adapter/frame and in the other of the two positions, the free ends of the bail latch are withdrawn inwardly into the adapter module so that they do not interferingly engage the adapter frame to thereby permit the adapter module to be easily removed from the bezel.

A further object of the present invention is to provide an adapter module with a retention bail latch that is moveable between two positions wherein the adapter module is either retained within a guide rail or removable therefrom, the bail latch preventing the cable assembly from being attached to the transceiver within the adapter module prior to installation of the adapter module into its host unit.

Yet another object of the present invention is to provide an adapter module with a moveable bail latch as described above, the module having a housing with a cam member formed therein proximate to the free ends of the bail latch, the bail latch engaging the cam members in its movement to thereby draw the bail latch free ends inwardly into the adapter module during movement of the bail latch to an open position.

A still further object of the present invention is to provide an adapter module that is easily insertable into an adapter frame, the adapter module having a cast housing that has a pair of slots formed therein extending lengthwise, the slots receiving corresponding opposing guide rails of a receiving frame, the adapter module slots having flared ends at their rear portions that provide a lead-in for the guide rails, the flared ends diverging from the width of the slots to a wider slot at an diverging angle therefrom so that the module may be tilted in its installation and/or removal.

Yet another object of the present invention is to provide an improved latching arrangement for an adapter module that includes a wire bail member with two free ends that are interconnected by a cross piece, the free ends being received within openings formed within sidewalls of a housing of the module, the ends being capable of being moved between two positions where the ends extend from openings exterior to sides of the module housing and where the ends are slightly recessed within the module housing openings, the module being received within an adapter frame mounted to a circuit board, the adapter frame having openings formed therein in alignment with the module housing openings so that when extended, the free ends of the bail extend into and engage the adapter frame openings, the adapter frame openings including wear sleeves in the form of hollow inserts that provide a wear surface within the adapter frame openings.

Another object of the present invention is to provide the aforementioned wear sleeves with an angled, or beveled surface, that serves as a lead-in surface, against which the bail free ends may contact when the module is inserted into the adapter frame, the beveled surfaces forcing the bail free ends to move toward the interior of the module in instances when the module is inserted with the bail member free ends extending from the module, so that the bail need not be in a particular position to permit the module to be inserted into the adapter frame.

A still further object of the present invention is to provide an improved mounting pin for adapter frames that are utilized with adapter modules and other electronic components, the mounting pin including a die-cast press-fit pin that is formed as part of the adapter frame and which depends downwardly therefrom for reception by a corresponding opposing mounting hole on a circuit board, the mounting pin including a cylindrical body with a vertical slot formed therein that extends from the tip end of the mounting pin to a point where the mounting pin meets the adapter frame, and preferably this point is removed from the ordinary mounting surface of the adapter frame by means of an undercut.

The present invention accomplishes these and other objects and aspects by virtue of its structure. In one principal aspect of the present invention, an adapter module is provided with a means for securing it in place within an adapter frame that is mounted to a circuit board. The module has a hollow body that is sized to receive therein an electronic device such as a connector, transceiver, optical to electrical connector or the like and the device may have a circuit board that extends outwardly therefrom for mating with an opposing connector mounted to the circuit board. The module body further may include an exterior flange that extends around it for flush engagement with either a faceplate or the front edge of an adapter frame mounted to the circuit board.

The securing means used with modules that are received by adapter frames of the present invention preferably takes the form of a U-shaped bail latch having free ends, which are received within openings formed in the module sidewalls and the free ends are interconnected by a horizontal bar that extends across the front of the module. The bail latch is moveable between two operative positions. In the first operative position, the bail latch bar lies across the front of the module and prevents connection therewith of any cable assemblies. In the second operative position, the bail latch is raised permitting insertion of cable assemblies into the module.

The module includes a pair of cam members having cam surfaces that the bail latch rides open in its movement. These cam members serve to draw the free ends of the bail latch inwardly so that the module may be inserted into, or removed from, the adapter frame. When the free ends of the bail latch are not cammed inwardly, they extend through an exterior of the module sidewalls and into an interference engagement with the adapter frame that prevents the module from being removed from the adapter frame.

In another principal aspect of the present invention, the adapter frame has a pair of guide rails that extend inwardly and the module has a pair of slots formed in its exterior that extend lengthwise of the module. These module slots receive the adapter frame guide rails. These slots open to the rear of the module and include a flared lead-in opening that permits the module to be tilted into place into the adapter frame or permit the module to be used with tilted adapter frames. Electromagnetic gaskets may be applied to the module flange in an orientation to engage and mate with opposing gaskets on the adapter frame. The bail latch may also be configured to accommodate a cable assembly.

In other important aspects of the present invention, the adapter frame into which the module fits is provided with a pair of openings that are aligned with the openings of the module through which the free ends of the bail latch extend so that when the module is inserted into the adapter frame, the free ends of the bail latch are in position to be moved into and out of the adapter frame openings. The present invention provides for a wear sleeve, that is preferably formed of a material different than that of the adapter frame. Typically, a hard material such as stainless steel will be used for the wear sleeve, so as to prevent scuffing and material erosion or wear from occurring on the points of the adapter frame opening which the bail latch free ends bear against.

The wear sleeve may take the form of a clip having either a V or other suitable shape. In instances of a V-shape, an angled or beveled edge is presented toward the front of the adapter frame and provides a contact lead-in surface that the free ends of the module bail latch will bear against if the module is inserted with its bail latch in the engaged position.

The ends of the bail latch bear against the angled surfaces of the wear sleeve and they are cammed back into the module as the module is further inserted into the adapter frame and preventing the module engagement mechanism from stubbing on the adapter frame.

The adapter frame may also have C-shaped press fit mounting pins formed as part of the frame, in which a cylindrical pin body is provided with a vertical slot so that the mounting pins have an overall C-shape when viewed from an end thereof. The pins may be integrally formed with the frame, or they may be inserted into cavities formed in the frame. Countercuts may be made in the frame adjacent the press fit pins that extend above the board datum or mounting surface to increase the length of the central slot or cut in the pin and increase its flexibility. These C-shaped mounting pins act as compliant pins for a die-cast structure used in electronic applications.

Other objects, features and advantages of the invention will be apparent from the following detailed description taken in connection with the accompanying drawings.

BRIEF DESCRIPTION OF THE DRAWINGS

The invention, together with its objects and the advantages thereof, may be best understood by reference to the following description taken in conjunction with the accompanying drawings, in which like reference numerals identify like elements in the figures and in which.

DETAILED DESCRIPTION OF THE PREFERRED EMBODIMENTS

Figure 1:
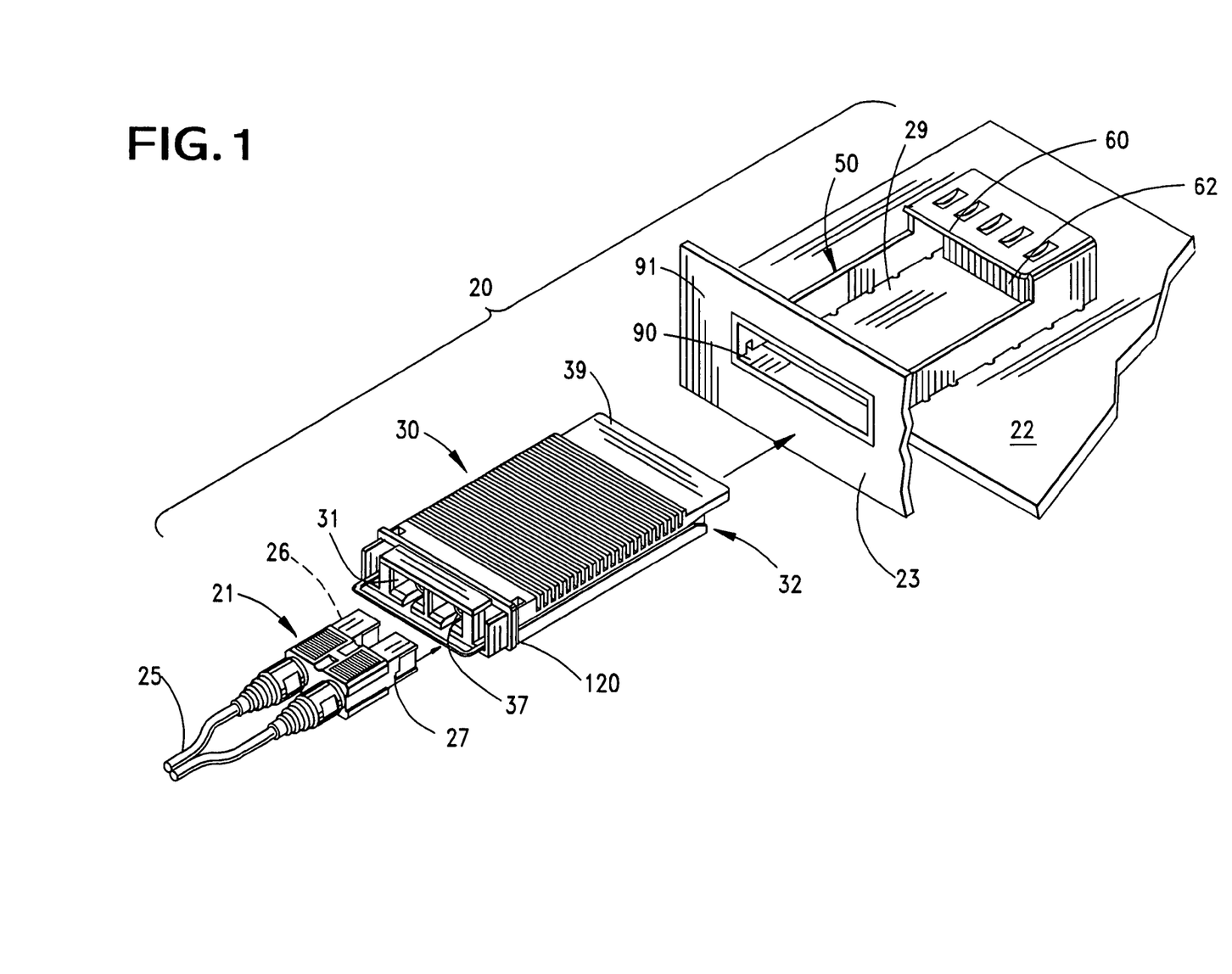
FIG. 1 is an exploded perspective view of an adapter frame/module assembly that utilizes an adapter module constructed in accordance with the principles of the present invention in its operational environment with a cable assembly.

FIG. 1 illustrates an electrical assembly 20 that is used to provide an interface between one device (not shown) that has a cable assembly 21 leading from it to another electronic device (also not shown) that has a circuit board 22 associated therewith and which is enclosed in a housing 23. Such assemblies are commonly used in the telecommunication industry and may include a fiber or other type of optical deice that transmits signals through a fiber optic cable 25 which are terminated to one or more transmitters 26, that are housed within connector housing 27 that are illustrated as plug connectors in the drawings.

Figure 4:
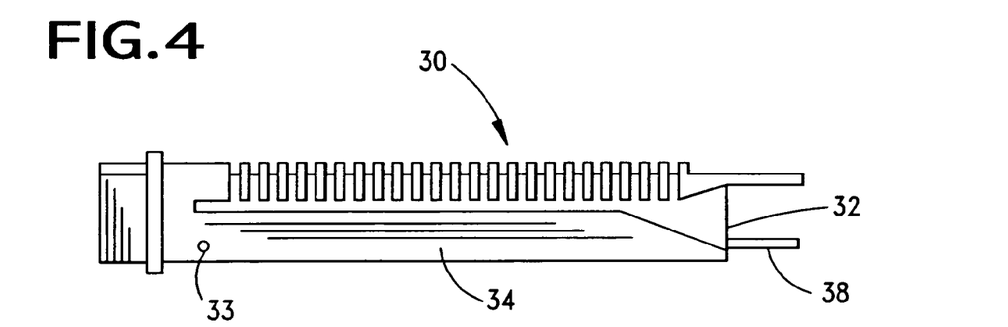
FIG. 4 is a side elevational view of the adapter module of FIG. 3, with the bail latch removed for clarity.

These cable assemblies 21 plug into what is known in the art as an adapter module 30 that in turn is received within an adapter frame 50 that is mounted to the circuit board 22 and that partially surrounds, or encloses, a connector 60 mounted on the circuit board 22 and having a plurality of conductive terminals 62 that are terminated to circuits on the circuit board 22. The module 30 houses one or more electronic devices, typically converters that connect high speed signals from copper cables or fiber optic cables to electrical signals that can be transmitted through the connector terminals 62 and onto the selected circuits on the circuit board 22. The electronic devices may typically include a pair of optical converter heads 37 that are contained in nests, or openings 31, of the module 30 and these conversion heads may include additional electronic structure that ends in a circuit board 38 (FIG. 4) that extends out from the rear face 32 of the module 30. One type of module and its internal components are illustrated and described in U.S. Pat. No. 6,062,893, issued May 16, 2000.

Figure 2:
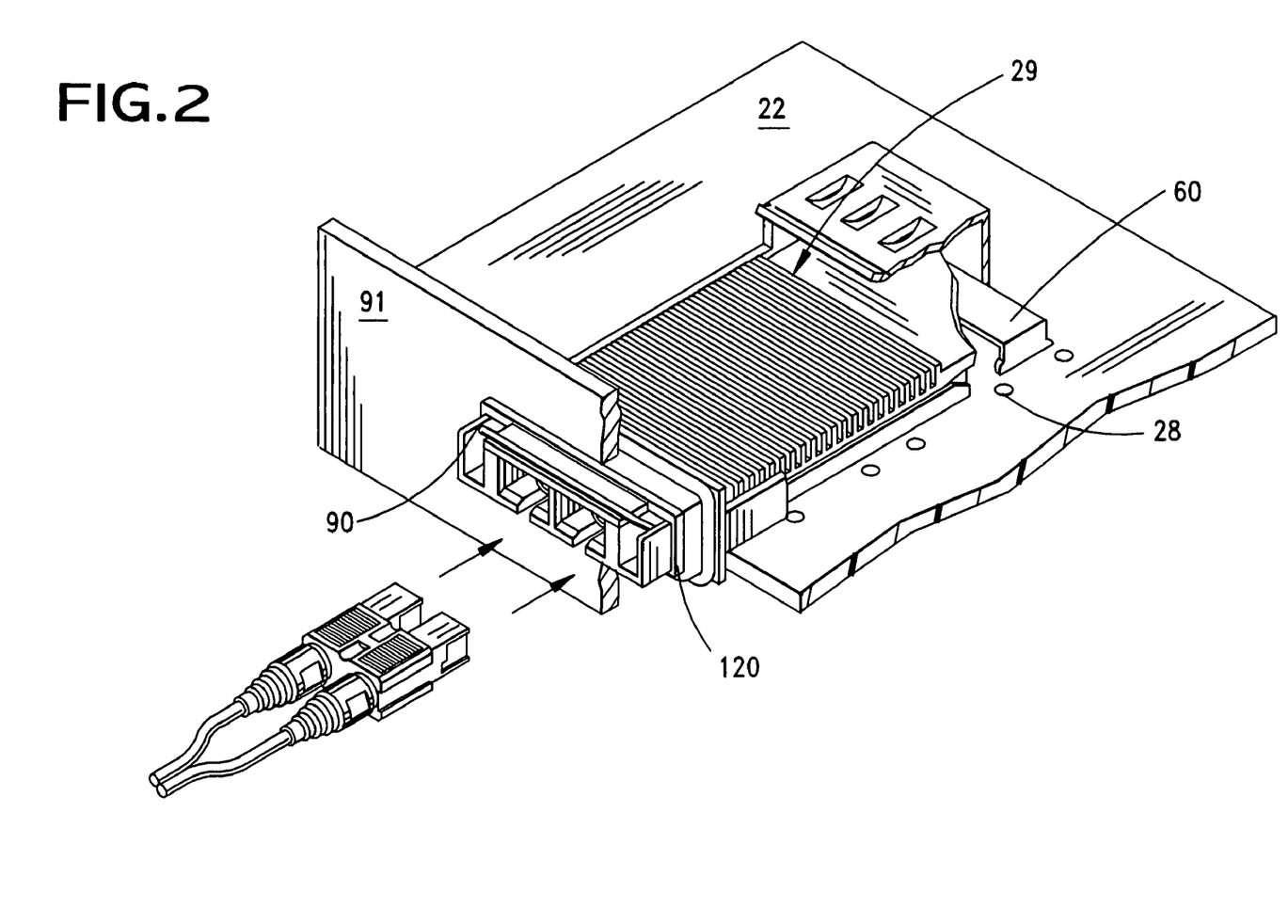
FIG. 2 is the same view as FIG. 1, but partially cutaway and illustrating the adapter module in place within its adapter frame and ready to receive the cable assembly therein.
Figure 3:
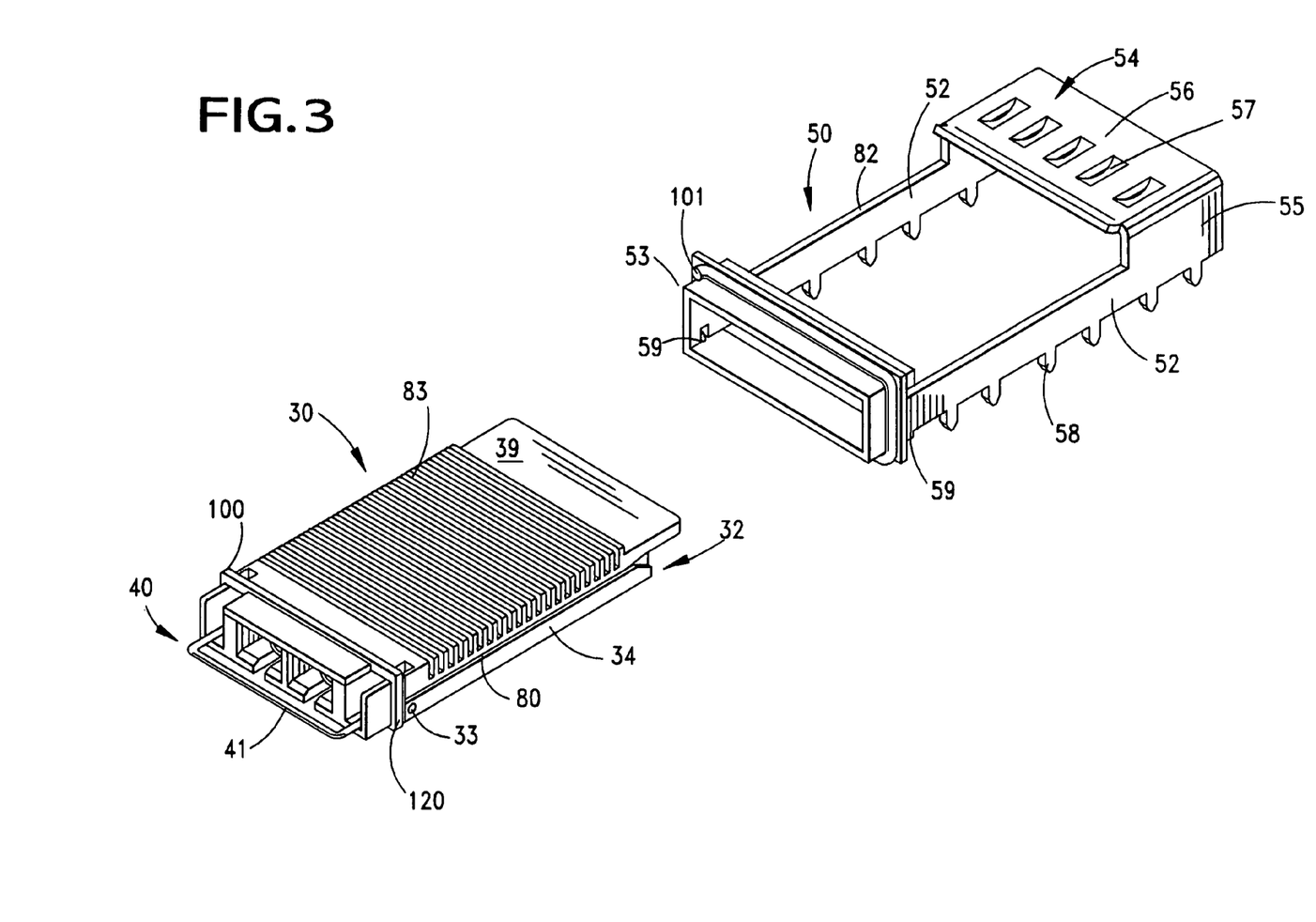
FIG. 3 is a perspective view of the adapter module and adapter frame of FIG. 1 in alignment with each other prior to insertion of the frame/module into the frame and illustrating the module in a position ready for insertion/removal from the frame.

The module 30 is received within an adapter frame 50 that is mounted to a circuit board 22. The adapter frame, as illustrated best in FIG. 3, is typically formed from a metal and is usually die-cast. The frame 50 has a rectangular shape with a pair of side walls 52 interconnected by opposing front and rear faces 53, 54. The rear face 54 of the adapter frame 50 includes a rear wall 55 that closes off the rear of the frame 50 and further includes a transverse rear member 56 with spring arms 57 formed therein that depend downwardly into the cavity 29 defined within the adapter frame 50. These spring arms 57 engage a rear ledge 39 (FIG. 1) formed in the module 30 in order to provide effective grounding of the module 30. This grounding into grounding circuits on the circuit board 22 and occurs primarily by way of a series of engagement pins 58 that are preferably formed as part of the adapter frame 50 and which may be received within plated holes, or vias 28 (FIG. 2) formed in the circuit board 22.

Returning to FIGS. 3 and 3A, the module 30 is preferably die cast from a conductive material and may be formed of one or more parts with a hollow internal cavity (not shown) that receives and houses converters, of which only the connector heads 37 and the rear circuit board 38 are shown.

Figure 8:
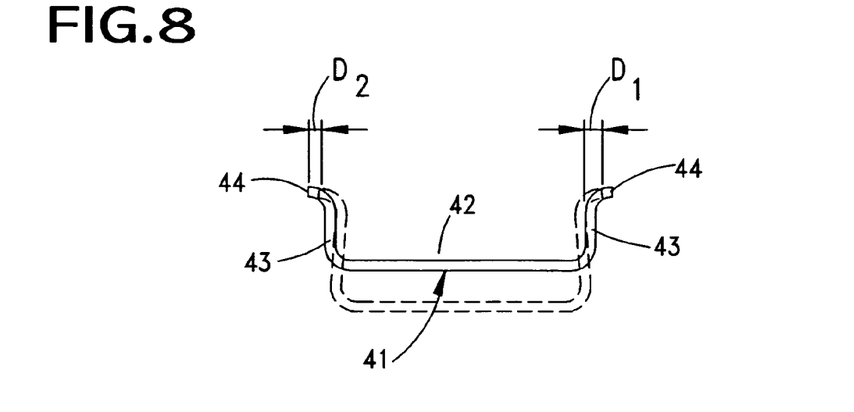
FIG. 8 is a diagrammatic view of the bail latch of the adapter module of the present invention illustrating the displacement that occurs therein during movement between its two operative positions.

The front face of the module 30 has a pair of openings 31, each communicating with a specific converter head 37. These openings 31 receive the connector housings 27 of the cable assembly plug connectors. In order to retain the module 30, within the adapter frame 50, a retention means 40 is provided in the form of a moveable (or rotatable) bail latch 41. As illustrated in FIG. 8, the bail latch 41 has a general U-shape having a base 42 that extends transverse to two legs 43. The legs 43 terminate in free ends 44 that also extend in the transverse direction of these free ends 44 and are received within a pair of openings 33 (FIGS. 3 and 4) that are formed in the sidewalls 34. The free ends 44 are movable in the openings 33 so that the bail latch 41 may be moved (preferably rotated) between first and second operative positions. In the first operative position, which is illustrated in FIG. 3, the bail latch 41 extends horizontally in front of the movable openings 31 and its base part 42 extends crosswise in front of the module openings 31 in a manner so as to interfere with insertion of the cable connector housing 27 therein. In this same position, the free ends 44 are drawn inwardly of the module sidewalls 34 and adapt the position shown by the dashed lines in FIG. 8 where the free ends 44 are drawn and do not project outside of the module sidewalls 34, as illustrated in FIG. 3.

Figure 3A:
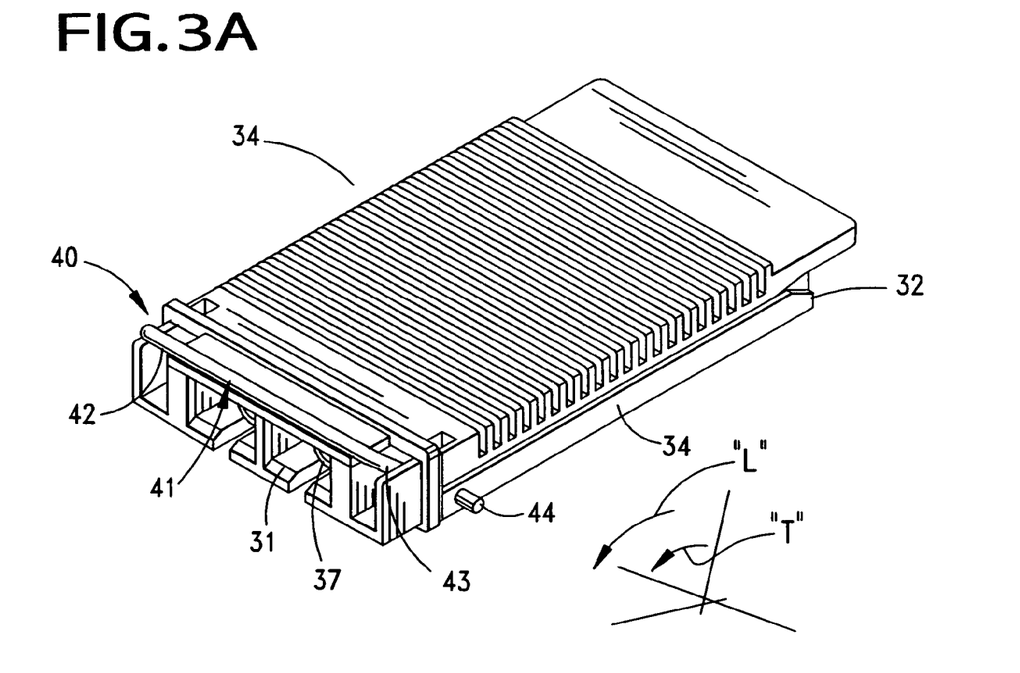
FIG. 3A is a perspective view of the adapter module of FIG. 3 with its bail latch moved to a retention or engagement position.
Figure 5:
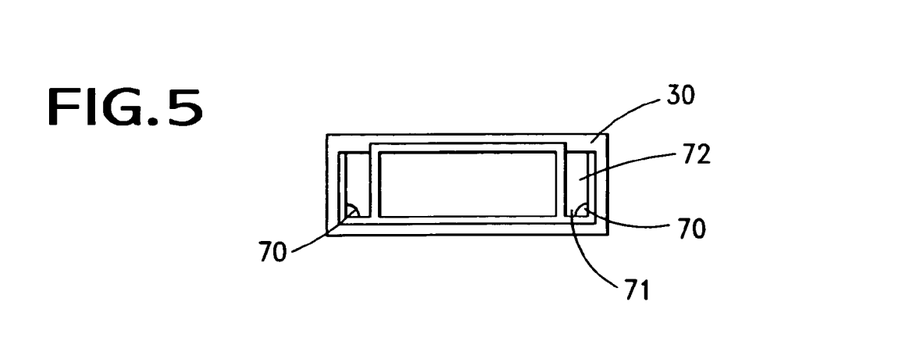
FIG. 5 is a front elevational view of the adapter module of FIG. 4.
Figure 6:
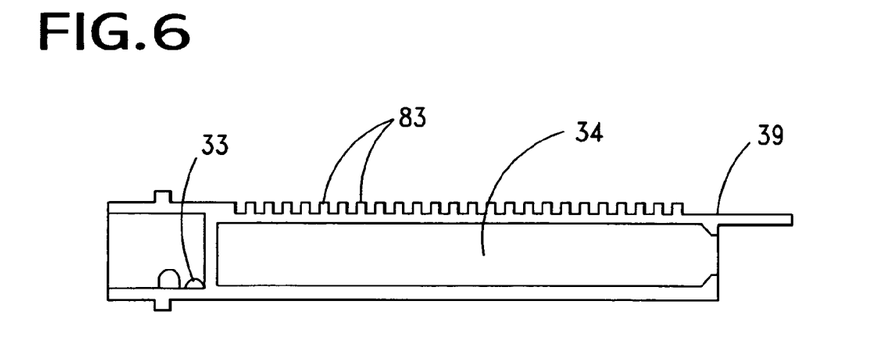
FIG. 6 is a lengthwise sectional view of the adapter module of FIG. 4.
Figure 9:
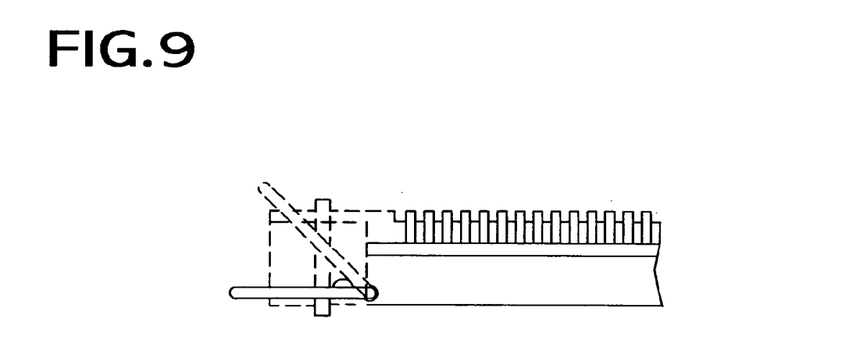
FIG. 9 is a partial side elevational view of the adapter module of the present invention illustrating the range of movement between the two positions of the bail latch.

In the second operative position, as illustrated in FIG. 3A, the bail latch 41 is raised up and over the openings 37 on the front face of the module 30. This position is shown in outline in FIGS. 8 and 9 and no interference is presented with any cable assemblies. In order to provide the inward-outwardly movement of the bail latch free arms 44 in concert with the upward-downward movement of the bail latch, the adapter module 30 includes a pair of cam members 70 that are preferably integrally formed with the module 30. As shown in FIG. 5, these cam members 70 are located along the inner base 71 of the slots 72. The cam member 70 are preferably three-dimensional bumps having covered surfaces that are curved with a radius both in the transverse direction "T" (FIG. 3A) and the longitudinal direction "L" so that the bail latch legs 43 will cam inwardly to pull the free ends 44 of the bail latch inwardly 20 that they do not project from the module sidewalls 34 and into the adapter frame openings 59.

Figure 7:
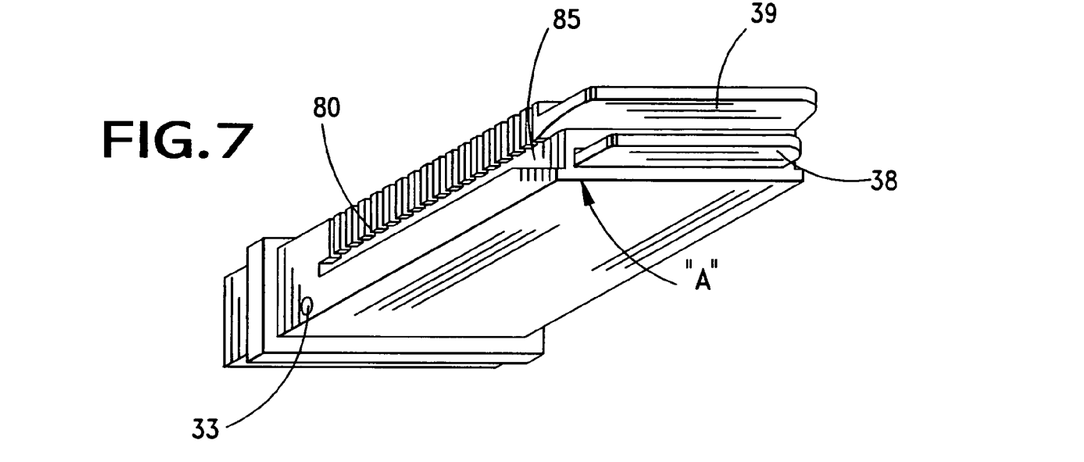
FIG. 7 is a perspective view of the adapter module of FIG. 4 taken from the underside thereof.
Figure 7A:
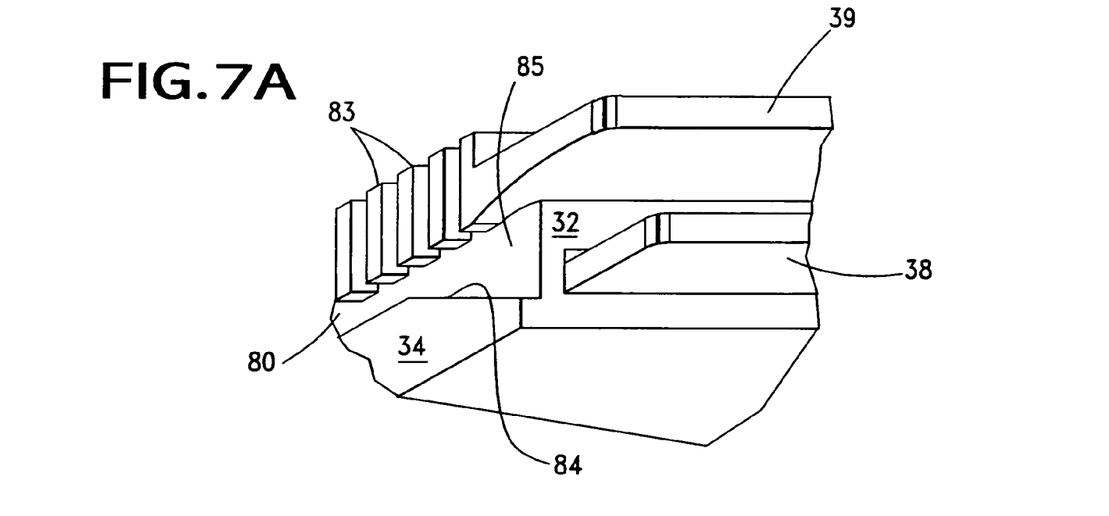
FIG. 7A is an enlarged detail view of the portion designated "A" in FIG. 7.

In another aspect of the present invention, the module 30, may have a pair of slots 80 formed therein that extend lengthwise of the module 30. These slots 80 receive and engage corresponding guide rails 82 that are formed as part of the adapter frame 50 and which bend inwardly into the internal cavity 29 of the frame 50. As seen best in FIGS. 7 and 7A, the slots 80 may be further disposed in the module sidewalls 34 just beneath the heat dissipating fins 83 that are preferably formed as part of the module 30. At the rear face 32 of the module 30, the slots 80 open in a diverging manner by way of an angled wall 84 to create a large opening 85 with an angled lead-in surface 84 that will permit the adapter module 30 to be tilted into place as to engage the adapter frame guide rails 82 or to engage an adapter frame 50 that is itself slightly tilted with respect to an opening 90 in a device face plate, or bezel 91.

Figure 12A:
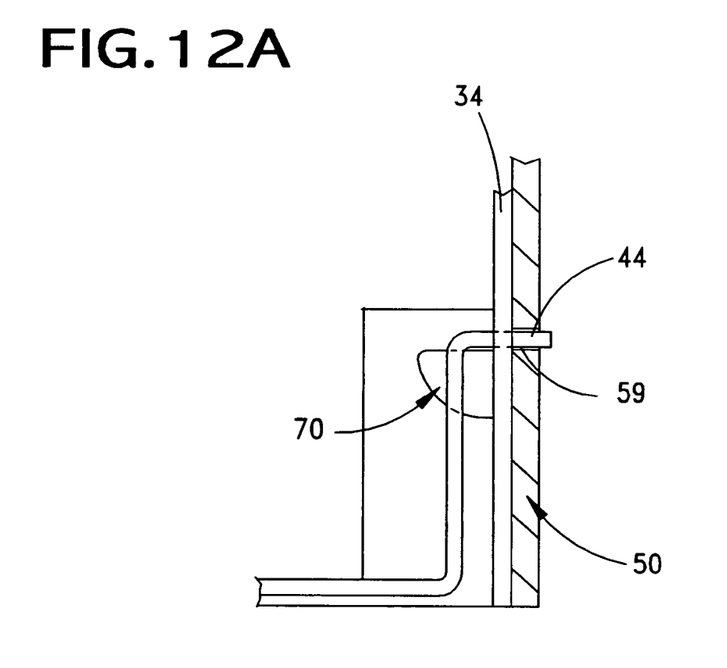
FIG. 12A is an enlarged detail view of the bail latch in a raised position such as is shown in FIG. 3A, with the bail latch positioned above the cam member.
Figure 12B:
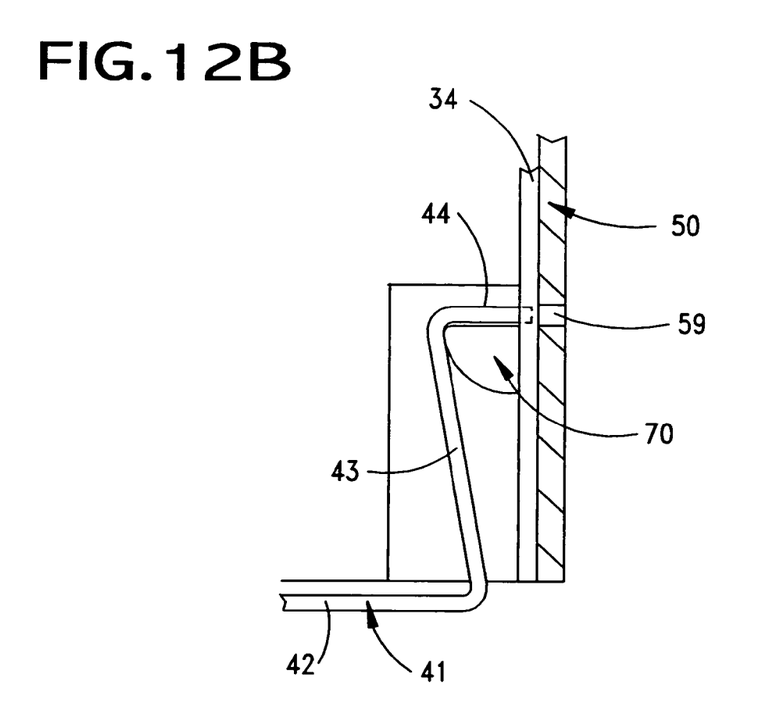
FIG. 12B is the same view as FIG. 12A, but with the bail latch in a depressed position as shown in FIG. 3 where the bail latch legs and free ends have deflected inwardly.

Turning now to FIGS. 12A and 12B, these figures show in detail the relationship between the cam member 70 and the bail latch 41. In FIG. 12A, the bail latch 71 extends up at an angle as in FIG. 3A and the latch legs 43 are positioned above the cam member 70. In FIG. 12B, the bail latch 41 has been moved down to a horizontal position as in FIG. 3 and it can be seen that the latch legs 43 have ridden down on the cam member 70 and so deflected inwardly. This deflection occurs along the latch legs 43 (shown as D1, in FIG. 8) and also along the latch free ends 44 (shown as D2 in FIG. 8). In this deflection, the free ends 44 are withdrawn from their engagement with the frame openings 59, and preferably partially into the module sidewall 34 so that the module 30 may be freely and easily inserted into and removed from the frame 50.

The module flange 120 may have an electromagnetic gasket 100 applied thereto as its rear face 50 so that it mates with a like electromagnetic gasket 101 supported on the adapter frame front face.

Figure 10:
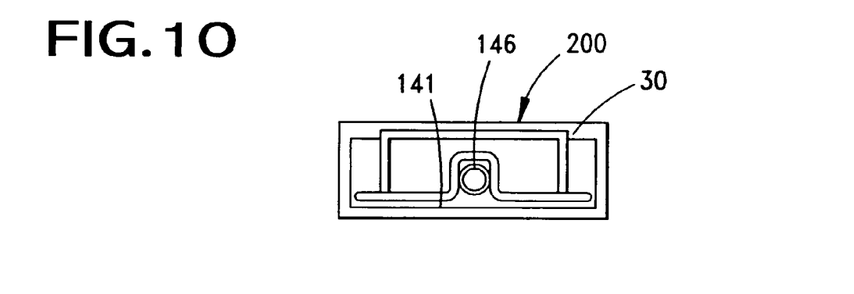
FIG. 10 is a front elevational view of an adapter frame/module having an alternative bail latch.
Figure 11:
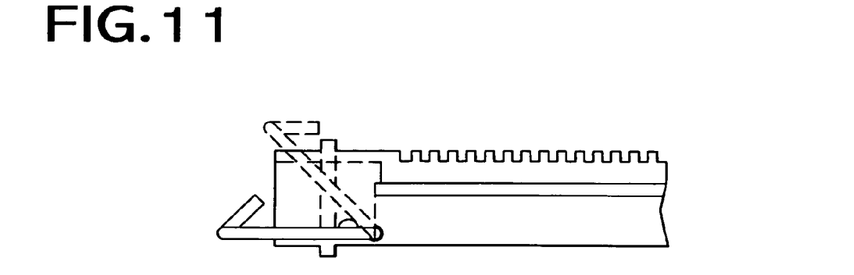
FIG. 11 is a partial side elevational view of the adapter frame/module of FIG. 10.
Figure 13:
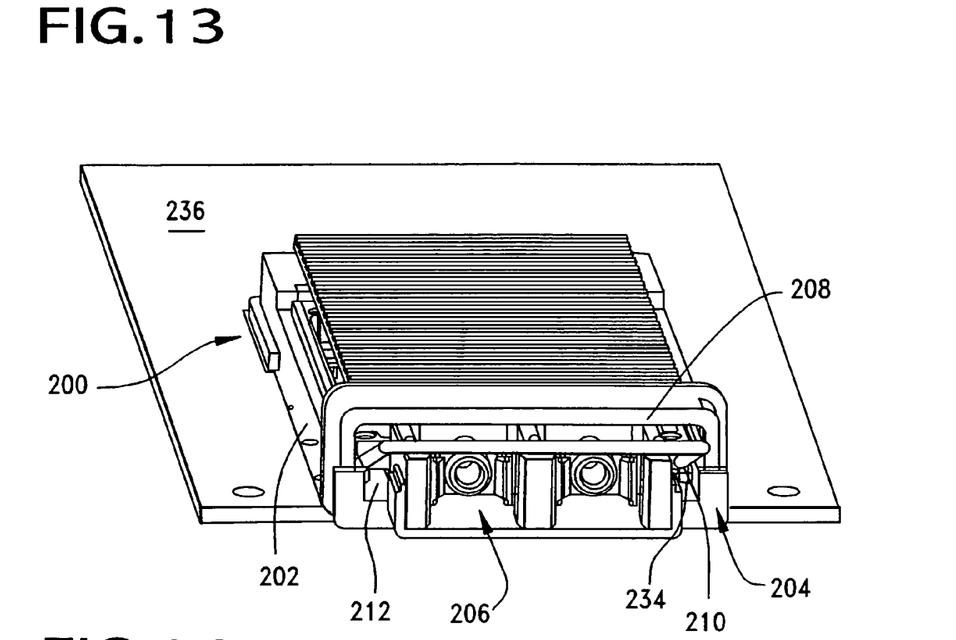
FIG. 13 is an angled perspective view of a module in place within an adapter frame and illustrating the bail latch in a up position, wherein the module is engaged with the adapter frame and which utilizes a cam member that is raised off the floor of the module.
Figure 14:
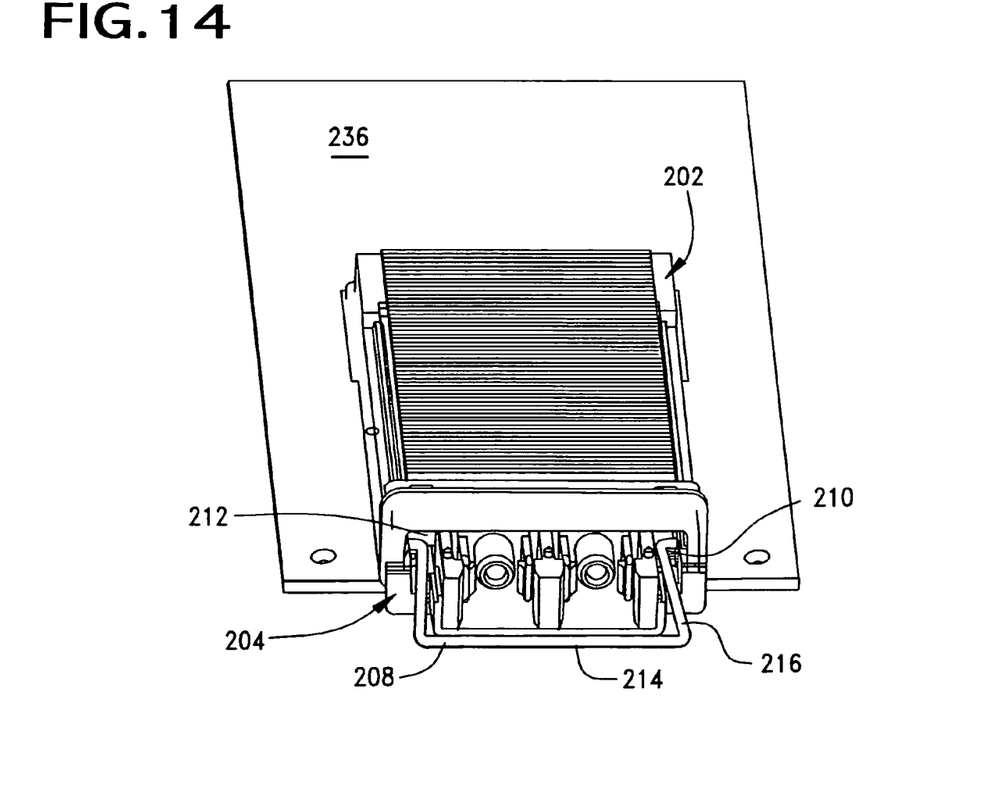
FIG. 14 is a similar view as FIG. 14, taken at a different angle, but illustrating the bail latch in a lowered position, wherein the module is disengaged with the adapter frame and the free ends of the bail latch are cammed out of engagement with the adapter frame.

Another embodiment 200 is illustrated in FIGS. 10-11 where the module 30 includes a bail latch 141 that has a recess or slot 146 formed therein to receive a cable or patch cord. FIGS. 13-19 illustrate the interaction of the bail latch free ends and the module adapter frame more clearly. In FIG. 13, the assembly 200 is shown as an adapter frame 202 that has a pair of side walls which are interconnected by rear and front members. The adapter frame 202 is shown mounted to a circuit board 236 and the frame holds an electronic module 204 therein. The module shown is an optical transceiver, but it will be understood that other suitable types of components may be used as modules.

The module 204 has a pair of openings 206 that communicate with its front face to permit the coupling thereto of cables and the like. The module 204 is equipped with a moveable bail latch 208 of the type described previously. The bail latch 208 has a U-shape with a base 214 that may by moved up or down into and out of interference with the module openings 206, and a pair of legs 216 that terminate in free ends 218. These legs 216 are moveable, or pivotable, within slots 212 disposed within the module 204 and they move, or pivot around their associated free ends 218. A cam member 210 is shown disposed within the slots 212 in a position to interfere with the movement of the bail latch 208, particularly the legs 216 thereof.

Figure 15:
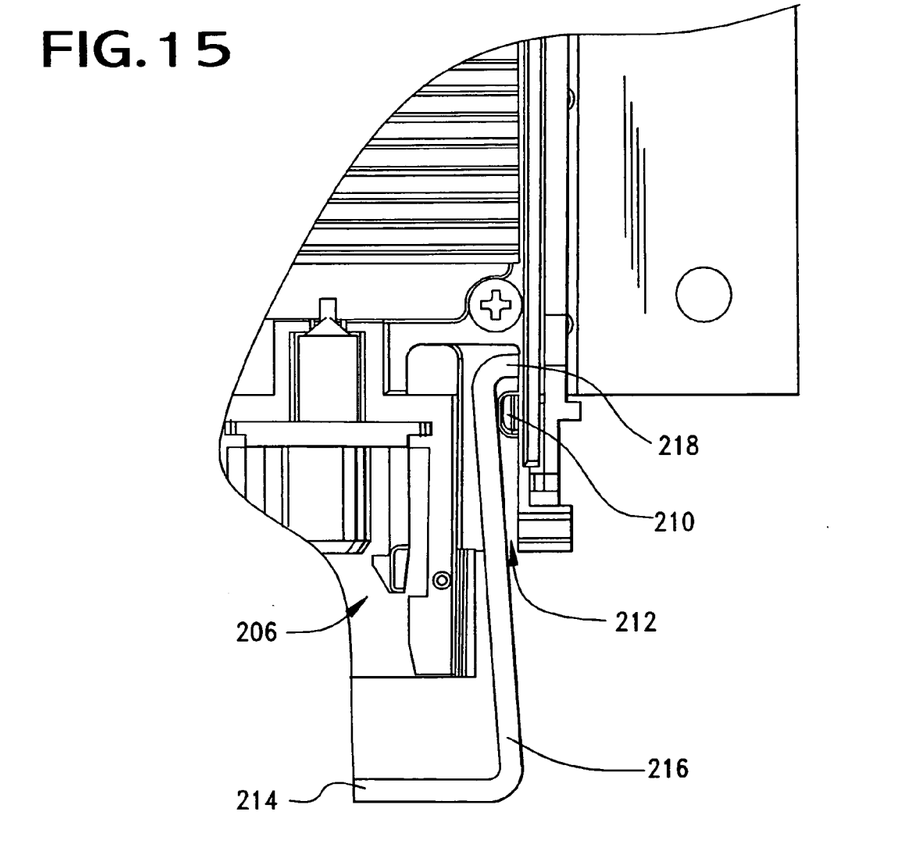
FIG. 15 is an enlarged, partial top plan detail view of the cam member and the bail latch when the module is in the position as illustrated in FIG. 14.
Figure 16:
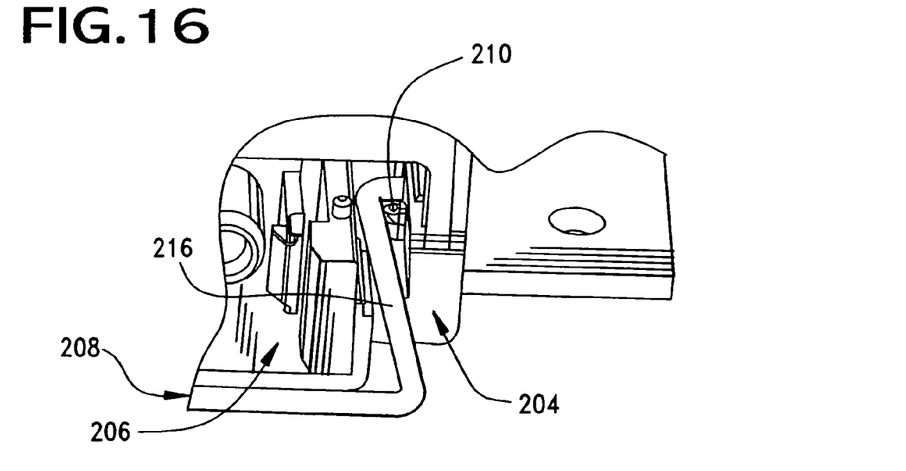
FIG. 16 is an angled enlarged detail view of the bail latch-cam member engagement when the bail latch is in a lowered position as shown in FIG. 14.
Figure 17:
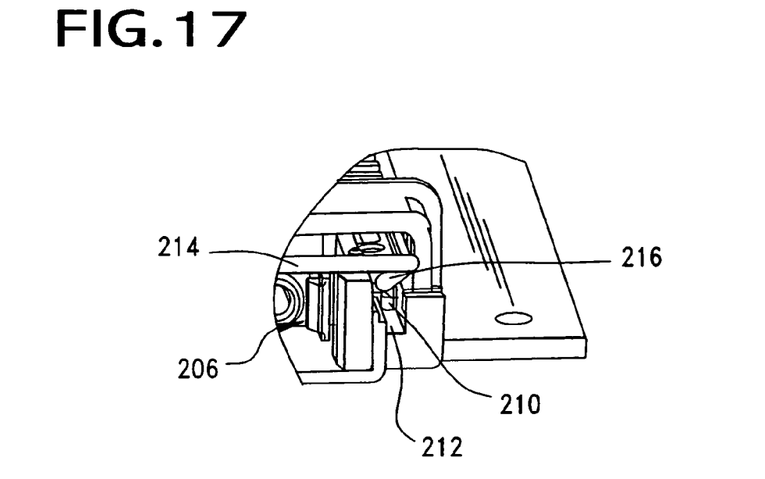
FIG. 17 is a view similar to that of FIG. 16, but of the bail latch-cam member in the position when the module is in the position as illustrated in FIG. 13.
Figure 18:
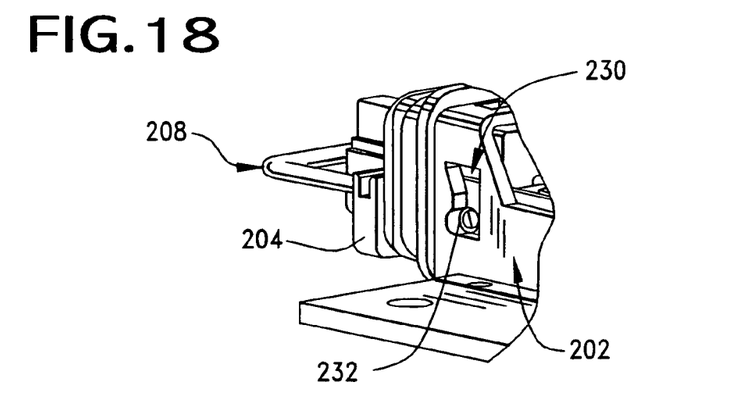
FIG. 18 is an enlarged detail view of the front side of the module as illustrated in FIG. 14, showing one free end of the bail latch disengaged from the adapter frame and the bail latch in front of the opening of the module to prevent insertion of a cable or other device therein.

As set forth above, the cam member 210 is positioned in the module 204, and preferably within the slots 212 thereof. It is positioned so that movement of the bail latch 208 causes the leg portions 216 thereof to contact the cam member 210. These leg portions 216 ride over the cam member 210, and the exterior surfaces thereof. This movement, as explained above, draws the free ends 218 of the bail latch inwardly and outwardly with respect to an imaginary centerline of the free ends. FIG. 18 illustrates the bail latch 208 in an insertion/removal position, where the bail latch 208 extends in front of and prevents the user from inserting a cable into the module opening 206. At this position, the bail latch leg portions 216 are cammed inwardly, as best illustrated in FIG. 15 and lie, preferably in abutting contact, against the cam member 210 as illustrated. This cam member 210 has a profile that extends upwardly from the floor of the module slot 206, as shown in FIG. 13, and need not have the quarter-spherical configuration shown in the preceding drawing Figures. Moreover, the quarter-spherical configuration may be positioned on the top of a post portion 234 to specify the point exactly where the camming action occurs in the rotation of the bail latch. The free ends 218 of the bail latch 208 have a length that is sufficient for them to clear engagement of the exterior adapter frame 202, so that the module may be inserted and removed without problem.

Figure 19:
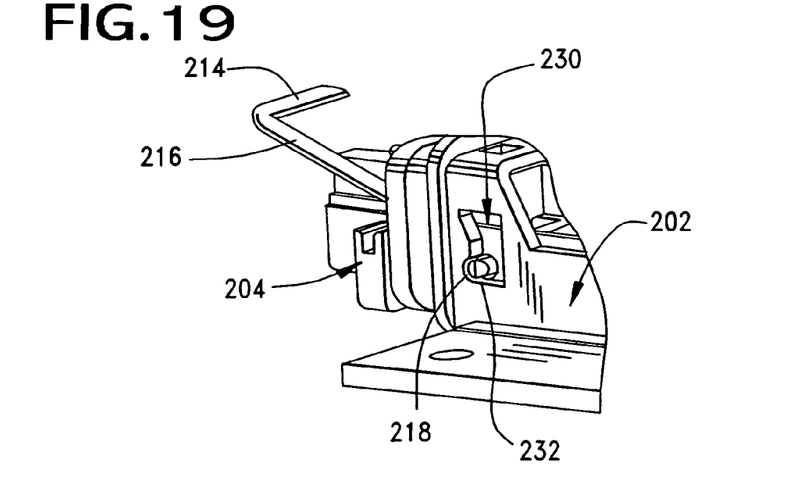
FIG. 19 is an enlarged detail view of the front side of the module as illustrated in FIG. 13, showing one free end of the bail latch engaged with the adapter frame and the bail latch raised above the opening of the module to permit insertion of a cable or other device therein.

Also, as illustrated in FIGS. 18 & 19, the attachment aperture 230 may be specially configured to include an arcuate recess 232 that receives the bail latch free end 218 therein when the bail latch is in the engaged position. The aperture 230 is aligned with the corresponding apertures formed in the bail latch in which the free ends 218 reside. The free ends 218 of the bail latch are shown in a retracted position in FIG. 18.

Figure 20:
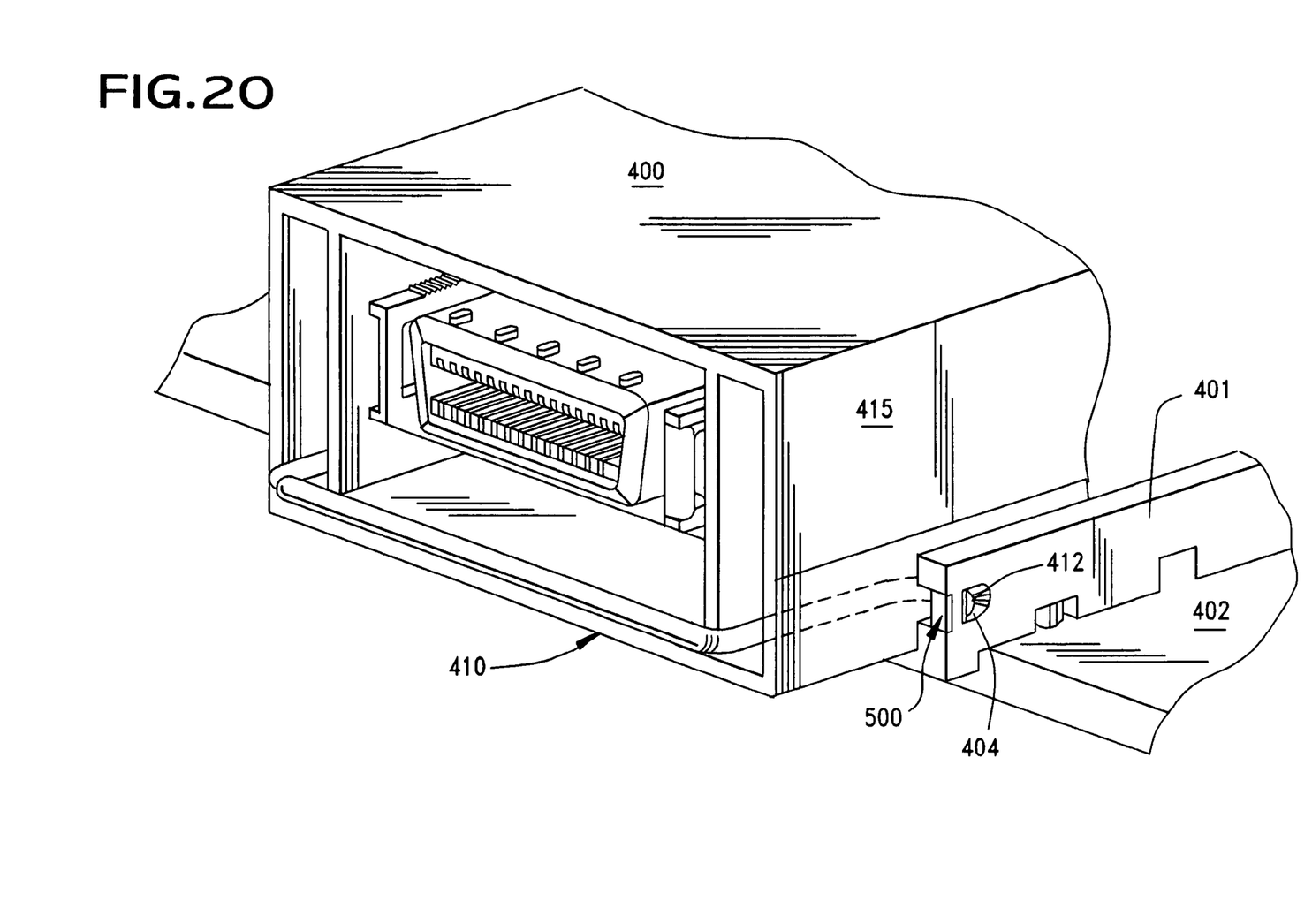
FIG. 20 is an enlarged, partial detail perspective view of an electronic module that is illustrated in place within an adapter frame, which is mounted to a circuit board, the adapter frame utilizing a wear sleeve constructed in accordance with the principles of the present invention.
Figure 21:
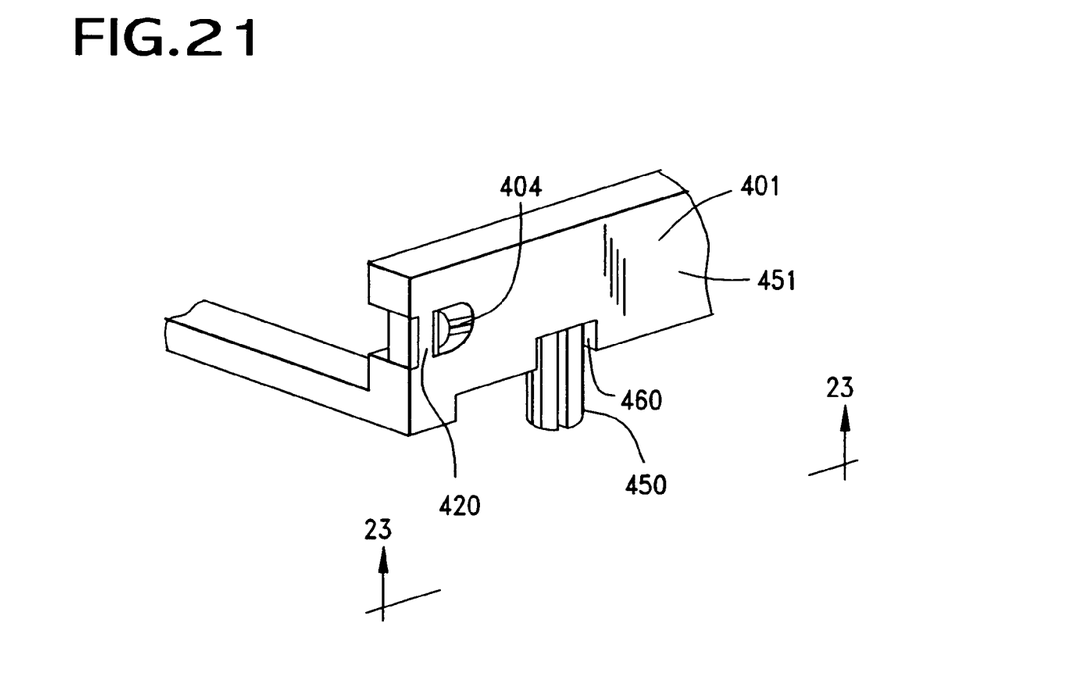
FIG. 21 is an enlarged detail view of the front end of the adapter frame, illustrating the location of the wear sleeves of the invention and the location of the C-shaped press fit pins of the invention.

Turning now to FIG. 20, a module 400 is shown engaged within an adapter frame 401 that is mounted to a circuit board 402. The adapter frame 401 into which the module 400 fits is provided with a pair of openings 404 that are aligned with the openings of the module (not shown) through which the free ends 412 of the arms 411 of the bail latch 410 extend so that when the module is inserted into and engaged the adapter frame 401. This occurs as stated in detail above, when the bail 410 is in an "up" position, where the free ends 412 of the bail latch 410 extend through the module openings and into the adapter frame openings 404. In the position shown in FIG. 20, the bail latch free ends 412 are cammed inwardly and they do not extend past the surfaces of the module sidewalls 415. In this position, the module 400 may be freely inserted into and removed from the receptacle area that the adapter frame 401 defines.

However, when the bail is moved to its up position, as shown in FIGS. 12A, 13, 17 & 19, the free ends 412 of the bail latch 410 extend out of the module. In order to prevent and potential forceful entry of the module 400 into the adapter frame 401, the present invention also utilizes a wear sleeve 500 that is attached to the adapter frame 401 at the openings 404 thereof. Although the following discussion and drawings show the wear sleeve as separate it will be understood that for its lead-in function, it may be formed as part of the frame 401 itself. One function which the sleeve 500 performs is to provide resistance to scuffing, abrasion or erosion of the metal from which the adapter frame 401 is made, typically die-cast zinc. This abrasion is caused by repeated insertions/removals (or "cycles") of the module 400. Another function of the sleeve is to provide a lead-in surface that is angled and that is disposed in alignment with a projection engagement element of the module, such as the free ends of the bail latch described herein as a preferred embodiment of a latching mechanism so that such free ends will be cammed inwardly if the module is inserted into the frame with the free ends of the latch projecting outwardly. This is to prevent stubbing of the latch ends from occurring on the adapter frame.

The wear sleeve is preferably formed of a material different than that of the adapter frame, and typically it is preferably made of a material that is harder that the frame, such as stainless steel or the like. In another aspect of the invention and as shown best in FIG. 24, the wear sleeve 500 preferably takes the form of a separate clip 501 having either a V-shape or other suitable shape. The wear sleeve may have a C-shape, and similar to the V-shaped already described, the sleeve may be considered to have a body portion that extends between two free end portions. In the instances of a V-shape, an angled or beveled edge 502 is formed on the body portion and is presented toward the front of the adapter frame 401 and provides a contact, or lead-in surface, 503 that the free ends 412 of the module bail latch 410 will bear against if the module 400 is inserted with its bail latch 410 in the engaged position, as described above. The free ends 412 of the bail latch 410 bear against the angled surfaces 503 of the wear sleeve 500 and they are forced or cammed back into the module openings as the module 400 is further inserted into the adapter frame 401.

Figure 24:
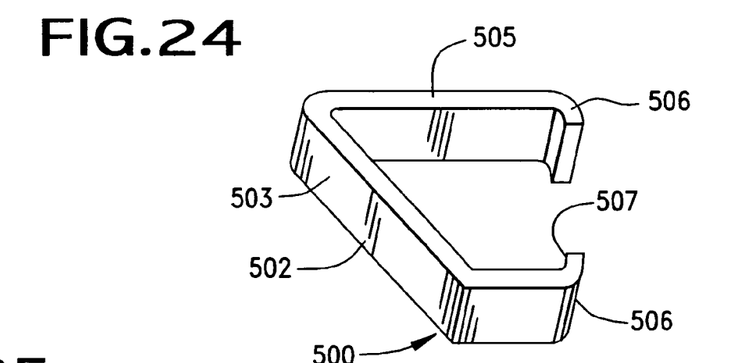
FIG. 24 is a perspective view of the wear sleeve of FIG. 20.
Figure 25:
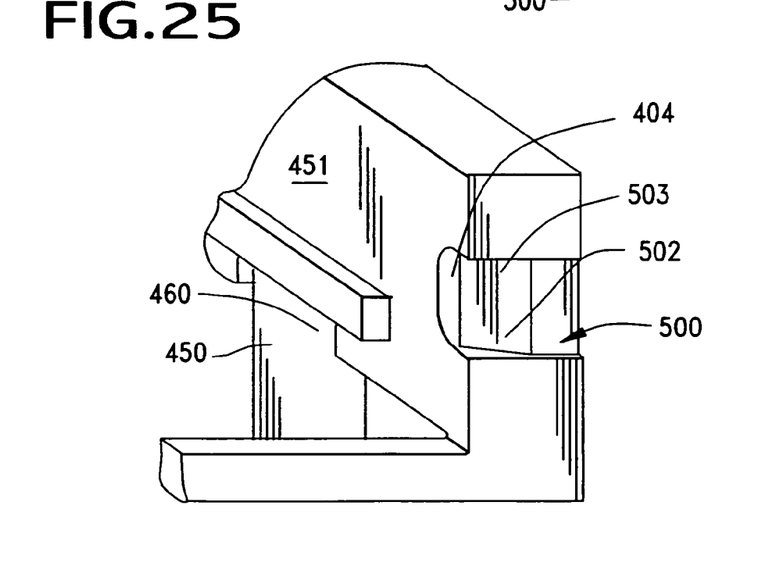
FIG. 25 is an enlarged detail front perspective view of the wear sleeve in place within an adapter frame and illustrating its beveled lead-in surface.

The wear sleeve 500 has two free ends 506 with clip edges 507 that engage opposing surfaces 420 of the frame 401 as shown. The angled surface 503 leads toward the interior of the adapter frame receptacle area and is thus slanted from its front to its back. Although the wear sleeve has been discussed in the context of a separate piece that is subsequently added to the frame 50, it will be understood that it can be integrally formed with the frame such as by a two-step casting process or it may be formed as an insert, around which the frame portion is cast.

Figure 22:
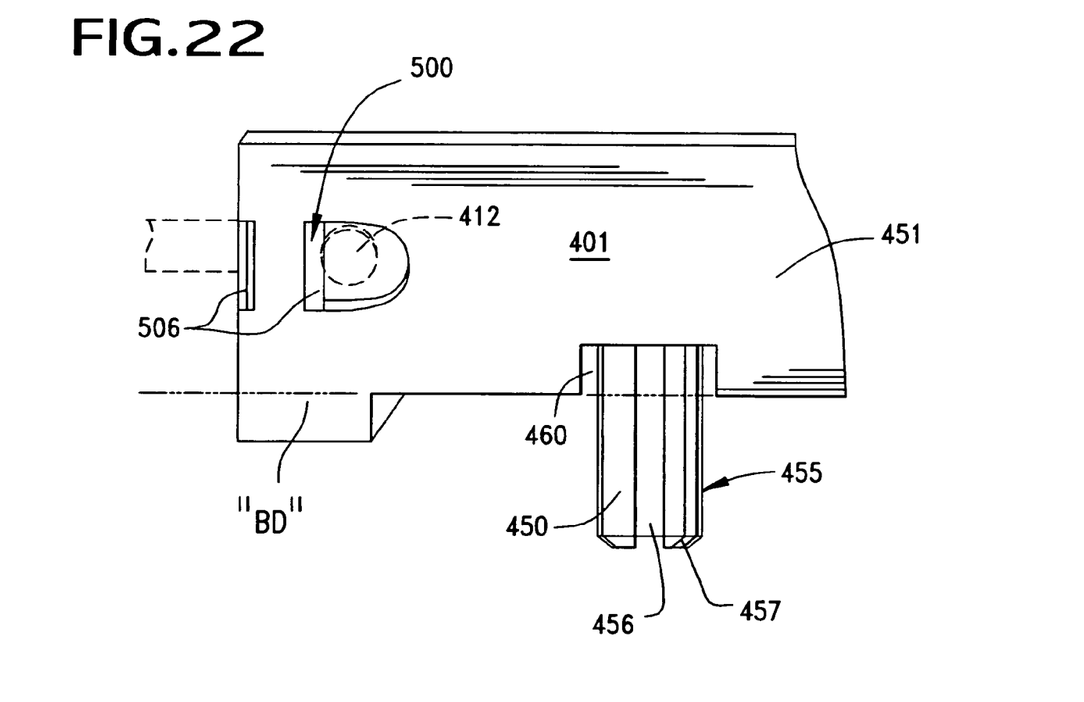
FIG. 22 is an enlarged detail view, taken from the side, illustrating a front end of the adapter frame of FIG. 21, and illustrating best the countercut around the press-fit mounting pins.
Figure 23:
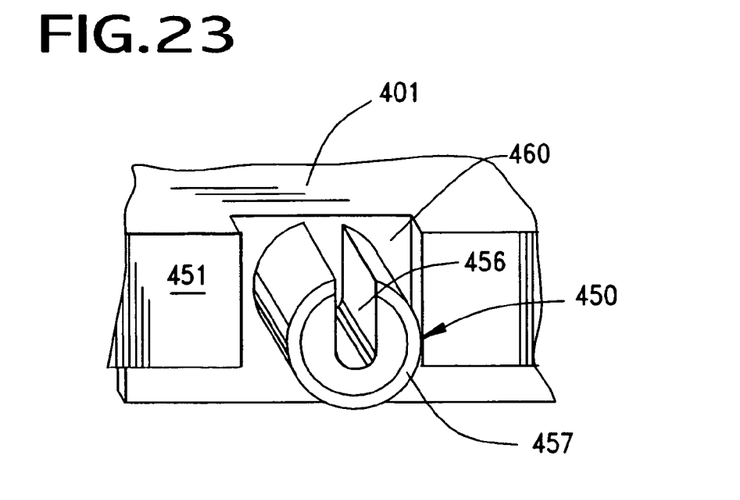
FIG. 23 is a bottom plan view of the press fit mounting pin of FIG. 22.

In another aspect of the invention, and as shown best in FIGS. 22 and 23, the adapter frame 401 may also have C-shaped press fit mounting pins 450 formed as part of the frame, particularly the sidewalls 451 thereof, in which a cylindrical pin body 455 is provided with an angled edge 457 and a vertical slot 456 formed therein so that the mounting pins 450 have an overall C-shape when viewed from an end thereof. The length of this slot preferably is equal to the height of the mounting pin 450 itself. The slot 456 is best described as a radial slot (FIG. 23) that extends from the center of the pin out to an exterior edge of the mounting pin. The slot, as shown in FIG. 23, may extend past the center of the pin to increase the compliant nature of the mounting pin 450.

Countercuts 460 may be made in the sidewalls of frame 401, preferably in the portions of the sidewall which are adjacent the mounting pins 450 that extend above the board datum "BD" or mounting surface to increase the length of the mounting pin and the depth of the central slot, or cut, 456 in the pin 450 to thereby increase its flexibility for secure mounting.

It will be understood that the invention may be embodied in other specific forms without departing from the spirit thereof. For example, although the cam has been described as having a partially spherical (quarter spherical) engagement face, other faces may be utilized so long as the camming action is provided. Also, although the wear sleeve has been described as V-shaped or C-shaped, it may take other forms, including that of an insert around which portions fo the adapter frame may be cast. The present examples and embodiments, therefore, are to be considered in all respects as illustrative and not restrictive, and the invention is not to be limited to the details given herein.

What is claimed is:

1. A frame for attachment to a circuit board, the frame, when attached to the circuit board defining a partial enclosure for an electronic module, said frame comprising:

a pair of sidewalls spaced-apart from each other, an entrance portion interconnecting said sidewalls together, the entrance and the sidewalls cooperatively defining a receptacle for receiving said module therewithin, said sidewalls including a plurality of compliant press-fit mounting pins integrally formed with said sidewalls and extending away from said frame, each of the mounting pins including a cylindrical body portion and a vertical slot formed in the body portion.

2. The frame of claim 1, wherein said mounting pins have C-shapes when viewed from an end.

3. The frame of claim 1, further including countercuts formed in said sidewalls adjacent said mounting pins, the countercuts surrounding said mounting pins, thereby defining spaces between said bottom surfaces of said sidewalls and the junction of said sidewalls with said mounting pins.

4. The frame of claim 2, wherein said vertical slots radially extend from exterior edges of said mounting pin into said mounting pin body portions.

5. The frame of claim 4, wherein said slots extend past centers of said mounting pin body portions.

6. The frame of claim 3, wherein each of said mounting pins include a vertical slot formed in their respective body portions, said slots extending for the full lengths of said mounting pins and up past the bottom surfaces of said sidewalls.

7. A frame for attachment to a circuit board, the frame, when attached to the circuit board defining a partial enclosure for an electronic module, said frame being formed from a conductive metal, said frame further comprising:

a pair of sidewalls spaced-apart from each other, an entrance portion interconnecting said sidewalls together, the entrance and the sidewalls cooperatively defining a receptacle for receiving said module therewithin, said sidewalls including a plurality of press-fit mounting pins integrally formed with said sidewalls and extending away from said frame, said sidewalls further including countercuts formed therein, the countercuts being adjacent said mounting pins, said countercuts surrounding said mounting pins so as to define an intervening space between said mounting pins and said sidewalls, the intervening spaces extending up from the bottom surfaces of said sidewalls for a predetermined length within said sidewalls.

8. The frame of claim 7, wherein said mounting pins include cylindrical body portions and said mounting pins each include a vertical slot formed in their respective body portions, the vertical slot extending for the entire lengths of said mounting pins, up past said bottom surfaces of said sidewalls.

* * * * *